United States Patent
Kraus et al.

(10) Patent No.: US 10,790,175 B2
(45) Date of Patent: Sep. 29, 2020

(54) SELECTIVE ETCH RATE MONITOR

(71) Applicant: APPLIED MATERIALS, INC., Santa Clara, CA (US)

(72) Inventors: Philip Allan Kraus, San Jose, CA (US); Timothy Joseph Franklin, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 70 days.

(21) Appl. No.: 15/955,375

(22) Filed: Apr. 17, 2018

(65) Prior Publication Data

US 2018/0240692 A1  Aug. 23, 2018

Related U.S. Application Data

(63) Continuation of application No. 15/351,437, filed on Nov. 14, 2016, now Pat. No. 9,978,621.

(51) Int. Cl.
  *H01L 21/67* (2006.01)
  *H01J 37/32* (2006.01)
  (Continued)

(52) U.S. Cl.
  CPC ....... *H01L 21/67253* (2013.01); *G01H 13/00* (2013.01); *H01J 37/32357* (2013.01);
  (Continued)

(58) Field of Classification Search
  CPC ......... H01L 21/67069; H01L 21/67155; H01L 21/67253; H01L 22/14; H01L 22/26
  (Continued)

(56) References Cited

U.S. PATENT DOCUMENTS 5,282,925 A  2/1994  Jeng et al.
5,665,166 A  9/1997  Deguchi et al.
(Continued)

FOREIGN PATENT DOCUMENTS

EP  1416247  5/2004
WO  0003421 A2  1/2000

OTHER PUBLICATIONS

International Preliminary Report on Patentability from PCT/US2017/056786 dated May 23, 2019, 11 pgs.
(Continued)

*Primary Examiner* — Duy T Nguyen
(74) *Attorney, Agent, or Firm* — Schwabe, Williamson & Wyatt, P.C.

(57) ABSTRACT

Embodiments include a real time etch rate sensor and methods of for using a real time etch rate sensor. In an embodiment, the real time etch rate sensor includes a resonant system and a conductive housing. The resonant system may include a resonating body, a first electrode formed over a first surface of the resonating body, a second electrode formed over a second surface of the resonating body, and a sacrificial layer formed over the first electrode. In an embodiment, at least a portion of the first electrode is not covered by the sacrificial layer. In an embodiment, the conductive housing may secure the resonant system. Additionally, the conductive housing contacts the first electrode, and at least a portion of an interior edge of the conductive housing may be spaced away from the sacrificial layer.

13 Claims, 7 Drawing Sheets

(51) Int. Cl.
*G01H 13/00* (2006.01)
*H01L 21/66* (2006.01)

(52) U.S. Cl.
CPC .. *H01J 37/32834* (2013.01); *H01J 37/32935* (2013.01); *H01L 21/67069* (2013.01); *H01L 21/67155* (2013.01); *H01L 22/26* (2013.01); *H01L 22/14* (2013.01)

(58) Field of Classification Search
USPC .......................................................... 257/734
See application file for complete search history.

(56) References Cited

U.S. PATENT DOCUMENTS

| | | | |
|---|---|---|---|
| 6,654,659 | B1 | 11/2003 | Lyons et al. |
| 7,052,622 | B2 | 5/2006 | Chinn et al. |
| 7,398,671 | B2* | 7/2008 | Brederlow ............ G01N 29/036 422/69 |
| 2005/0039852 | A1 | 2/2005 | Roche et al. |
| 2006/0211154 | A1* | 9/2006 | Buehlmann ............ B82Y 10/00 438/3 |
| 2006/0263576 | A1* | 11/2006 | Hirose ............... H01L 29/42384 428/149 |
| 2006/0283249 | A1 | 12/2006 | Liu et al. |
| 2007/0045228 | A1 | 3/2007 | Kubota et al. |
| 2007/0068456 | A1 | 3/2007 | Grimbergen et al. |
| 2007/0074562 | A1* | 4/2007 | Liu ...................... G01N 29/022 73/53.05 |
| 2007/0080611 | A1* | 4/2007 | Yamada ................... H03H 3/02 310/364 |
| 2007/0212807 | A1* | 9/2007 | Yamada ................ H01L 51/102 438/99 |
| 2008/0216956 | A1 | 9/2008 | Nakamoto et al. |
| 2009/0133470 | A1 | 5/2009 | Whalen et al. |
| 2010/0227420 | A1 | 9/2010 | Banna et al. |
| 2010/0258796 | A1* | 10/2010 | Horio ...................... H01L 33/28 257/43 |
| 2010/0270262 | A1 | 10/2010 | Hanawa et al. |
| 2014/0035440 | A1* | 2/2014 | Aida .................... H01L 41/0536 310/365 |
| 2015/0041867 | A1 | 2/2015 | Han |
| 2015/0380218 | A1 | 12/2015 | Tan et al. |
| 2016/0099705 | A1* | 4/2016 | Matsuda ............ H03H 9/02102 310/321 |

OTHER PUBLICATIONS

International Search Report and Written Opinion from PCT/US2017-056786 dated Feb. 2, 2018, 14 pgs.
Non-Final Office Action from U.S. Appl. No. 15/351,437, filed Nov. 14, 2016 dated Aug. 3, 2017, 18 pgs.
Extended European Search Report for EP17870524 dated May 7, 2020, 11 pgs.
Michael D. Baker, et al.: "A Novel in Situ Monitoring Technique for Reactive Ion Etching Using a Surface Micromachined Sensor." IEEE Transactions on Semiconductor Manufacturing, IEEE Service Center, Piscataway, NJ, US, vol. 11, No. 2, May 1, 1998 (May 1, 1998).
Bryan G. Morris, et al.: "Design and Development of an Integrated MEMS Sensor for Real Time Control of Plasma Etching," Technical Proceedings of the 2004 NSTI Nanotechnology Conference and Trade Show, Mar. 7, 2004, pp. 418-421.

* cited by examiner

SELECTIVE ETCH RATE MONITOR

CROSS-REFERENCE TO RELATED APPLICATIONS

This application is a continuation of U.S. patent application Ser. No. 15/351,437, now U.S. Pat. No. 9,978,621, filed on Nov. 14, 2016, the entire contents of which are hereby incorporated by reference herein.

BACKGROUND

Field

Embodiments relate to the field of etching processes for semiconductor manufacturing and, in particular, to systems and methods for providing real time etch rate monitoring in radical only etching processes.

Description of Related Art

In semiconductor etching processes, it is often difficult to monitor the etch rate in real time. As such, etch rates can typically only be determined by calculating the difference between a starting thickness of a film and an ending thickness of the film and dividing the difference by the total processing time. However, it is to be appreciated that monitoring the etch rate in real time provides additional information that may be used to tune etching processes so that they are precise and have a higher degree of repeatability, among other advantages.

Some solutions to provide real time etch rate monitoring have been developed. For example, optical emission spectroscopy (OES) and absorption spectroscopy are solutions that have been used in traditional plasma etching chambers. In OES, the intensity of the optical emission from the plasma may be correlated to the etch rate. In absorption spectroscopy a line of sight path through the process volume is needed. However, a line of sight through the process volume is often not available in high volume manufacturing equipment.

SUMMARY

Embodiments include a real time etch rate sensor and methods of for using a real time etch rate sensor. In an embodiment, the real time etch rate sensor includes a resonant system and a conductive housing. The resonant system may include a resonating body, a first electrode formed over a first surface of the resonating body, a second electrode formed over a second surface of the resonating body, and a sacrificial layer formed over the first electrode. In an embodiment, at least a portion of the first electrode is not covered by the sacrificial layer. In an embodiment, the conductive housing may secure the resonant system. Additionally, the conductive housing contacts the first electrode, and at least a portion of an interior edge of the conductive housing may be spaced away from the sacrificial layer.

Additional embodiments may include a radical only etching process tool. In an embodiment, the radical only etching process tool may include a remote plasma chamber and a main processing chamber coupled to the remote plasma chamber. In an embodiment, the main processing chamber include an upper portion and a lower portion that is separated from the upper portion by an ion filter, and a pump liner formed around a pedestal in the lower portion. In an embodiment, the radical only etching process tool may also include a real time etch rate sensor located in the lower portion of the main processing chamber. In an embodiment, the real time etch rate sensor includes a resonant system and a conductive housing. The resonant system may include a resonating body, a first electrode formed over a first surface of the resonating body, a second electrode formed over a second surface of the resonating body, and a sacrificial layer formed over the first electrode. In an embodiment, at least a portion of the first electrode is not covered by the sacrificial layer. In an embodiment, the conductive housing may secure the resonant system. Additionally, the conductive housing contacts the first electrode, and at least a portion of an interior edge of the conductive housing may be spaced away from the sacrificial layer.

Additional embodiments may include methods for etching a substrate with a closed loop process recipe. In an embodiment, the method may include executing the process recipe on a substrate in a processing chamber. The process recipe may include one or more process parameters and an endpoint criterion that is determinable from outputs obtained from a real time etch rate sensor located in the processing chamber. The method may then continue by determining whether the endpoint criterion is satisfied by analyzing one or more outputs from the real time etch rate sensor. Embodiments may then include terminating the process recipe once the endpoint criterion is satisfied. In some embodiments, the endpoint criterion is a total thickness of material removed, and the one or more outputs from the real time etch rate sensor that are used to determine if the endpoint criterion is satisfied may be a resonance frequency of the real time etch rate sensor prior to executing the process recipe and a present resonance frequency of the real time etch rate sensor after the process recipe has been initiated.

DETAILED DESCRIPTION

Systems and methods for using a sensor for real time etch rate monitoring in a radical only etching process are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, real time etch rate monitoring provides information that may be used to improve various process outcomes of the etching process. While OES and absorption spectroscopy have been used in plasma etching operations, they are significantly limited in radical only etching processes. For example, in a radical only etching process OES is not feasible, because there is not a significant optical emission from the radical species in the process volume where the substrate is etched. In absorption spectroscopy, in addition to line of sight requirements described above, the absorption of light by many radical species used for etching is strongest in the deep ultra violet (UV) frequencies. Accordingly, the optics needed for measurements are complex and expensive. Furthermore, the signal to noise ratio in absorption spectroscopy is poor because there are relatively few radicals compared to background parent molecules.

Figure 1:
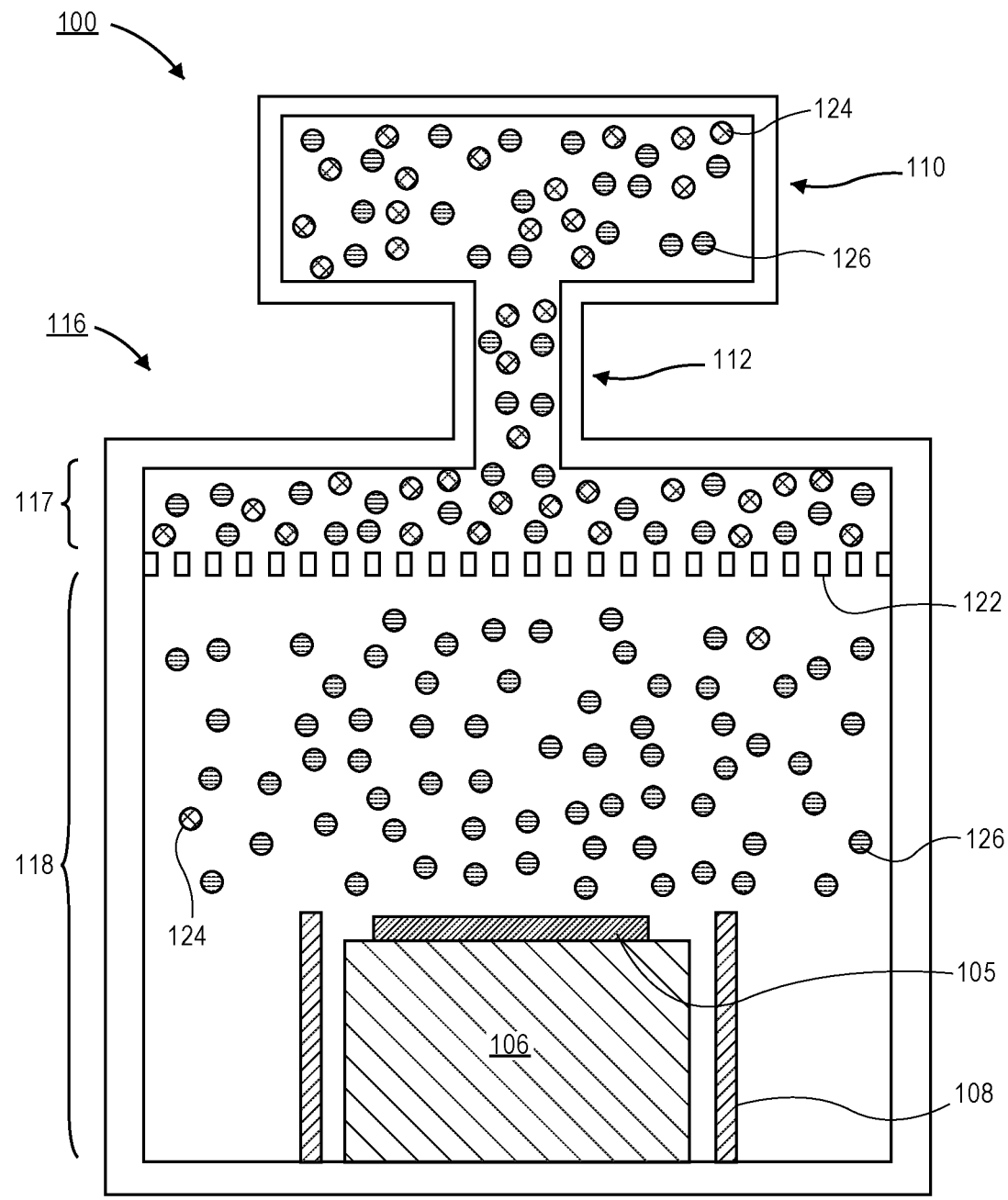
FIG. 1 is a schematic illustration of a processing tool for implementing a radical only etching processing, according to an embodiment.

As used herein, a radical only etching process is an etching process that relies substantially on radical species to remove a material. FIG. 1 is a schematic cross-sectional illustration of a processing tool 100 that may be used to implement a radical only etching process, according to an embodiment. In an embodiment, the processing tool 100 may include a remote plasma. One or more processing gasses may be flown into a remote plasma chamber 110 through valves (not shown). The processing gasses may be ionized with a power source (e.g., a radio-frequency source) to form a plasma that includes ions 124 and radicals 126. Plasma may then be transported through a remote plasma transport region 112 to the main processing chamber 116. In an embodiment, the main processing chamber 116 may include an upper region 117 and a lower region 118. The upper region 117 and the lower region 118 may be separated by an ion filter 122. In an additional embodiment, the ion filter 122 may also be located in the transport region 112 or another intermediate chamber between the remote plasma chamber 110 and the main processing chamber 116.

According to an embodiment, the ion filter 122 may prevent ions 124 from passing to the lower region 118 of the main processing chamber 116, while at the same time allowing the radical species 126 to pass through to the lower region 118 of the main processing chamber 116. For example, in the upper region 117 the ratio of radical species 126 to ions 124 may be approximately 1:1, and in the lower region 118 the ratio of radical species 126 to ions 124 may be approximately 25,000:1 or greater. In some embodiments, the ratio of radical species 126 to ions 124 may be approximately 100,000:1 or greater. Due to the high ratio of radicals 126 to ions 124, etching processes using such a processing tool 100 may be considered a radical only etching process. The radical species 126 may then interact with a surface of a substrate 105 positioned on a pedestal 106. In an embodiment, a pump liner 108 may be formed around the perimeter of the pedestal 106 in order to direct the flow of radicals 126 towards the substrate 105. It is to be appreciated that radical only etching process tool 100 illustrated in FIG. 1 is exemplary in nature and highly simplified by removing components known to those skilled in the art (e.g., vacuum pumps, heating elements, electrical components, among others) in order to not obscure aspects of various embodiments. In a particular embodiment, the radical only etching process tool 100 may be a Producer® Selectra™ Etch system manufactured by Applied Materials, Inc. of Santa Clara, Calif.

Since OES and absorption spectroscopy are not viable solutions for real time etch rate monitoring in such radical only etching processes, embodiments described herein include a sensor that uses a resonant system for etch rate monitoring. A resonant system measures a change in the resonance frequency of a resonating body. As the mass of the resonant system changes, the resonance frequency of the resonating body changes monotonically. When such a sensor is used to monitor the etch rate in a radical only etching process, the resonant system may include a sacrificial film that is formed over one face of the resonating body and is exposed to the radicals in the processing tool 100. The radicals etch away the sacrificial film, and the overall mass of the resonant system decreases. The decrease in mass of the resonant system causes an increase in the resonance frequency of the resonating body, which is measured in real time, and the rate of change of resonance frequency is converted to a rate of change of mass of the resonant system. The rate of change of mass of the resonant system may then be converted to a rate of change of thickness since the density of the film material is known.

Sensors that use resonant systems have been used in the past to provide real time deposition rates for deposition processes (e.g., evaporation, sputtering, and the like). However, previous etching solutions were not able to utilize sensors that use resonant systems for various reasons. One reason is that previous etching processes (e.g., reactive ion etching (RIE)) are not purely a material removal process. For example, as a material is being removed, additional byproducts may redeposit onto the substrate. For example, in a silicon etch with RIE a polymer may be redeposited onto the surfaces. This polymer improves anisotropic etching, but also adds to the mass of the substrate. Accordingly, if a sensor with a resonant system were used in such an etching process, the total mass of the film removed could not be accurately determined because there would also be an increase in mass that is attributed to the polymer redeposition. Additionally, the presence of the ions in the plasma and the RF power produce significant interference with the signal from the sensor. As such, a reliable reading with a suitable signal to noise ratio is much more difficult to obtain compared to the process environment in a radical only etching process.

Figure 2A:
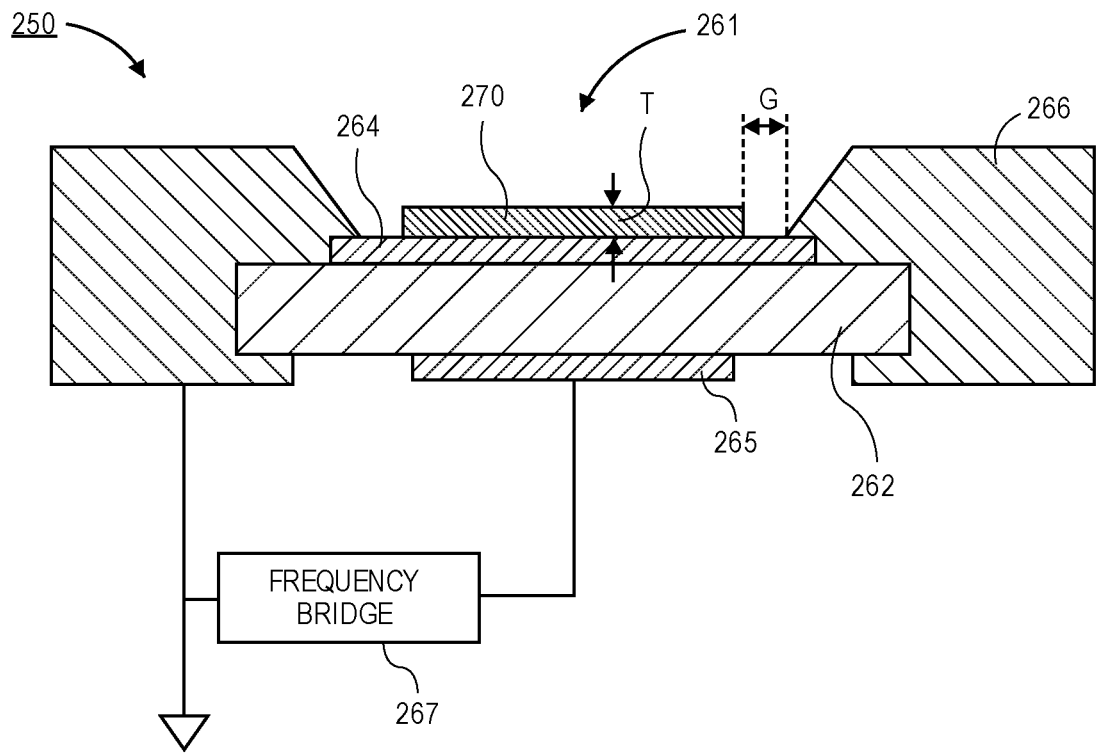
FIG. 2A is a cross-sectional illustration of a sensor that may be used to provide real time etch rate monitoring, according to an embodiment.

Referring now to FIG. 2A, a cross-sectional illustration of a sensor 250 that may be used to provide real time etch rate monitoring during a radical only etching process is shown, according to an embodiment. In an embodiment, the sensor 250 may include a resonant system 261 and a housing 266. Embodiments may include a resonant system 261 that includes a resonating body 262, a first electrode 264, a second electrode 265, and a sacrificial layer 270.

The resonating body 262 may be a material that changes resonant frequency as the mass of the resonant system 261 changes. In an embodiment, the resonating body 262 may be a piezoelectric material. For example, the resonating body 262 may be quartz, sapphire, semiconducting materials, such as silicon, germanium, or other III-V semiconductor materials, lead zirconate titanate (PZT), or the like.

In an embodiment, the resonant system 261 may include a first electrode 264 formed on a first surface of the resonating body 262 and a second electrode 265 formed on a second surface of the resonating body 262 that is opposite from the first surface. The first electrode 264 and the second electrode 265 may be any suitable conductive material. In one embodiment, the first and second electrodes 264, 265 may be aluminum, or the like. In the illustrated embodiment, the first and second electrodes 264, 265 do not cover the entire surface of the resonating body 262, but it is to be appreciated that embodiments are not limited to such configurations. For example, the first and second electrodes 264, 265 may cover the entire surface of the resonating body 262 in some embodiments. Additionally, embodiments may include first and second electrodes 264, 265 that have different surface areas. For example, the second electrode 265 may have a smaller surface area than the first electrode 264. In yet another embodiment, the surface areas of the first and second electrodes 264, 265 may be substantially the same.

In an embodiment, the resonant system 261 may include a sacrificial layer 270 formed on a surface of the first electrode 264. The addition of the sacrificial layer 270 changes the mass of the resonant system 261 and, therefore, alters the resonance frequency of the resonating body 262. Accordingly, as the thickness of the sacrificial layer 270 is reduced during an etching process, the resonance frequency of the resonating body 262 changes monotonically, as described above. In an embodiment, the sacrificial film 270 is the same material that is to be etched with a radical only etching process. For example, the sacrificial film 270 may be a dielectric material, a semiconductor material, or a metallic material.

The sacrificial layer 270 may be formed with a known thickness T. In an embodiment, the thickness T of the sacrificial layer 270 may be greater than the thickness of the material that will subsequently be etched away from a substrate being processed. Since etching is a subtractive process, increasing the thickness T of the sacrificial layer 270 increases the lifespan of the sensor 250 before the sensor 250 needs to be replaced or refurbished. For example, the thickness T of the sacrificial layer 270 may be sufficient to run a given etching process recipe multiple times without needing to replace the sensor 250. In an embodiment, the thickness T of the sacrificial layer 270 may be chosen to allow for a process recipe to be run ten or more times before the sacrificial layer 270 is completely removed. Additional embodiments may allow for a process recipe to be run one hundred or more times before the sacrificial layer 270 is completely removed. Additional embodiments may allow for a process recipe to be run one thousand or more times before the sacrificial layer 270 is completely removed. In some embodiments, the sacrificial layer may have a thickness T that allows for a process recipe to be run ten thousand times before the sacrificial layer 270 is completely removed.

In an embodiment, the sacrificial layer 270 is formed over a portion of the first electrode 264 such that at least a portion of the first electrode 264 remains exposed. At least a portion of the first electrode is exposed in order to provide a location where an electrical contact to the first electrode 264 may be made. For example, the sacrificial layer 270 may be formed in the center of the first electrode 264, leaving an exposed portion of the first electrode 264 around the periphery of the sacrificial layer 270.

In an embodiment, the resonant system 261 may be secured by a housing 266. In an embodiment, the housing 266 may be a conductive material. In an embodiment, the housing 266 may provide an electrical connection between a frequency bridge 267 and the first electrode 264. In an embodiment, the second electrode 265 may be electrically coupled to the frequency bridge 267. In some embodiments, the housing 266 may be grounded so that the first electrode 264 is held at ground potential.

Figure 2B:
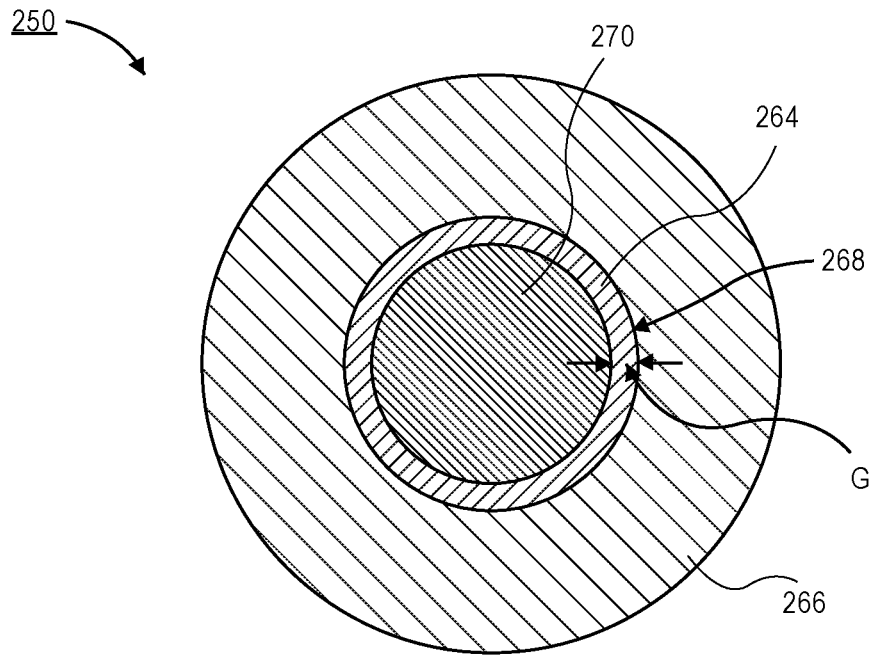
FIG. 2B is plan view illustration of the sensor in FIG. 2A, according to an embodiment.

Referring now to FIG. 2B, a top view of the sensor 250 is shown, according to an embodiment. In an embodiment, an interior edge 268 of the housing 266 is spaced away from the sacrificial layer 270 by a gap G. The gap G exposes a portion of the first electrode 264. In an embodiment, the gap G may be approximately 5 mm or less. In an embodiment, the gap G may be approximately 5% of the radius of the first electrode 264 or less. In the illustrated embodiment, the gap G between the interior edge 268 of the housing 266 and the perimeter of the sacrificial layer is substantially uniform since the sacrificial layer 270 is the same shape as the opening in the housing 266 and is substantially centered within the opening of the housing 266. However, embodiments are not limited to such configurations and the gap G may not be substantially the same at all points between the interior edge 268 of the housing and the perimeter of the sacrificial layer 270. For example, the sacrificial layer 270 may be a different shape than the opening in the housing 266 and/or the sacrificial layer 270 may not be substantially centered within the opening in the housing 266. In embodiments, the connection between the housing 266 and the first electrode 264 is not continuous along the interior edge 268; however, in such embodiments, the gap G is still present for one or more of the discrete connection locations between the housing 266 and the first electrode 264.

Since the first electrode 264 is exposed to the radicals in the radical only etching process, embodiments include a first electrode 264 that is formed with a material that is substantially resistant to the radical only etching process used to etch the sacrificial layer 270. Otherwise, the first electrode 264 may be etched along with the sacrificial layer 270, and several problems would arise. One such problem would be that the change in mass of the resonant system 261 would be the sum of the material loss of the first electrode 264 and the material loss of the sacrificial layer 270. As such, the change in resonance frequency of the resonating body 262 would not correspond to the etch rate of the sacrificial layer 270 only. Additionally, removal of the first electrode 264 and/or the housing 266 by the radical only etching process reduces the useable service life of the sensor 250.

In the illustrated embodiment, the sensor 250 is shown having resonant system 261 that includes a single sacrificial layer 270. However, embodiments are not limited to such configurations. For example, multiple sacrificial layers $270_1$-$270n$ may be formed over the first electrode 264. In such embodiments, so long as each of the sacrificial layers have a high etch selectively with respect to each other, a single sensor 250 may be used to provide real time etch rates for several different etching recipes. For example, a first etch of a silicon oxide layer may be monitored and then a second etch of a silicon layer may be monitored without needing to change the QCM 250. Some exemplary embodiments that include multiple sacrificial layers $270_1$-$270n$ are shown in the plan view illustrations in FIGS. 2C and 2D.

Figure 2C:
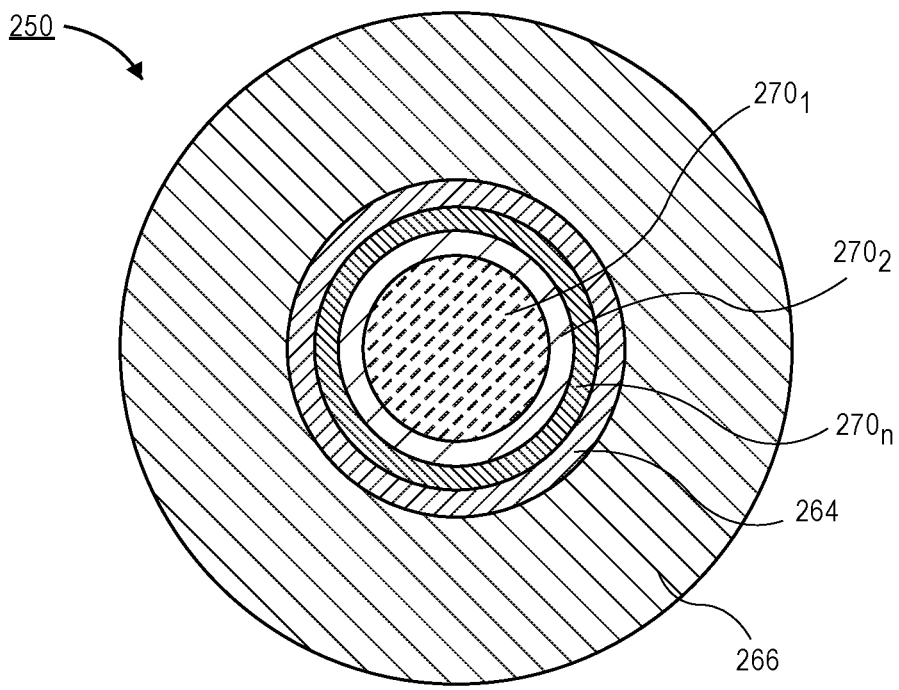
FIG. 2C is plan view illustration of a sensor that may be used to provide real time etch rate monitoring for more than one material, according to an additional embodiment.
Figure 2D:
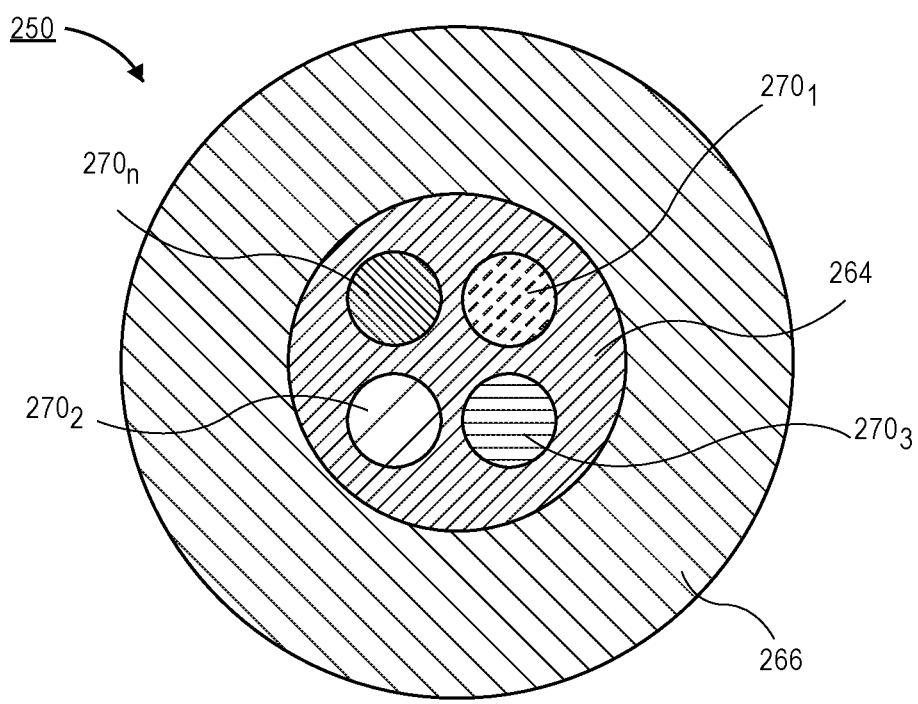
FIG. 2D is plan view illustration of a sensor that may be used to provide real time etch rate monitoring for more than one material, according to an additional embodiment.

In the embodiment illustrated in FIG. 2C, a plurality of sacrificial layers $270_2$-$270n$ are formed in concentric rings around a first sacrificial layer $270_1$. In an embodiment, each sacrificial layer $270_1$-$270n$ may be substantially the same thickness. In an additional embodiment, two or more of the sacrificial layers $270_1$-$270n$ may have different thicknesses. Providing sacrificial layers with different thicknesses may allow for a longer service life before the sensor 250 needs to be refurbished. For example, the processing used in the fabrication of a semiconductor device may include removing a greater thickness of a first material that corresponds to the first sacrificial layer $270_1$ than a thickness of a second material that corresponds to the second sacrificial layer $270_2$. As such, a sensor 250 with a first sacrificial layer $270_1$ that has a thickness that is greater than a thickness of the second sacrificial layer $270_2$ may ensure that both sacrificial layers are completely consumed after approximately the same number of substrates have been processed.

Additional embodiments include a plurality of sacrificial layers $270_1$-$270n$ that are formed in patterns over the surface of the first electrode 264 other than concentric rings. For example, in FIG. 2D each sacrificial layer $270_1$-$270n$ is formed in a different region. In some embodiments, each of the sacrificial layers $270_1$-$270n$ may be spaced apart from each other. In other embodiments, each of the sacrificial layers $270_1$-$270n$ may contact one or more other sacrificial layers. Furthermore, while each sacrificial layer $270_1$-$270n$ is shown as having substantially the same area, embodiments are not limited to such configurations and the area of each sacrificial layer $270_1$-$270n$ may be different from each other. Similar to the embodiment described with respect to FIG. 2C, the thickness of each sacrificial layer $270_1$-$270n$ may be substantially similar to each other, or the thickness of each sacrificial layer $270_1$-$270n$ may be different.

Figure 3A:
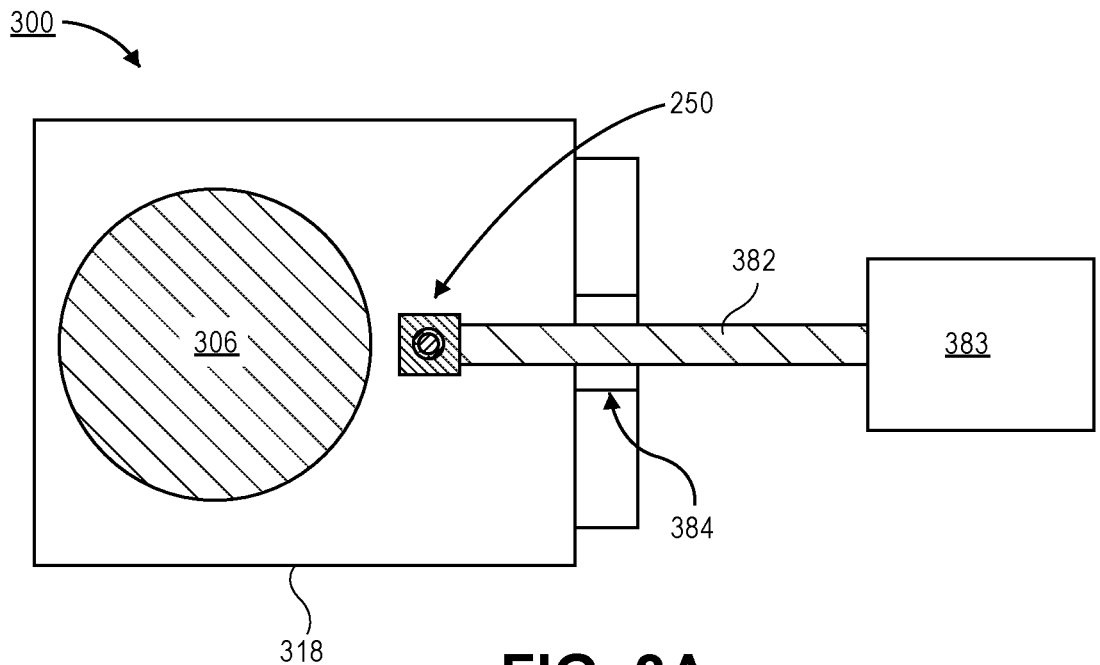
FIG. 3A is a schematic illustration of a processing tool for implementing a radical only etching process that shows the location of a sensor, according to an embodiment.

Referring now to FIG. 3A, a schematic illustration of a processing tool 300 that includes a sensor 250 is shown, according to an embodiment. In an embodiment, the sensor 250 may be electrically coupled to a monitor 383 that is located outside the processing tool 300 by a probe 382. The monitor 383 may include circuitry for monitoring the resonance (e.g., a frequency bridge) and any other electrical components and/or circuitry needed for monitoring the etch rate in real time. Additional embodiments may include a monitor 383 that is communicatively coupled with a computer system (not shown) that is used to control the etching process in the processing tool 300. In an embodiment, the probe 382 may be inserted through a port 384 in the processing tool 300. For example, the probe 382 may be inserted into the lower region 318 of the processing tool 300 proximate to the pedestal 306. Locating the sensor 250 in the lower region 318 results in the sensor 250 being exposed to the radicals without substantial interaction with ions formed in the remote plasma. In an embodiment, the sensor 250 may be oriented so that the face of the first electrode is substantially parallel to a face of pedestal 306 on which a substrate (not shown) may be placed during processing. Though not shown in FIG. 3A, embodiments may include a sensor 250 that is located between a pump liner and the pedestal 306 or outside of the pump liner. In an embodiment, the sensor 250 may be located at a position in the processing tool 300 that allows for the etch rate of the sacrificial layer 270 to be representative and correlatable to the etch rate of a material formed on a substrate positioned on the pedestal.

Figure 3B:
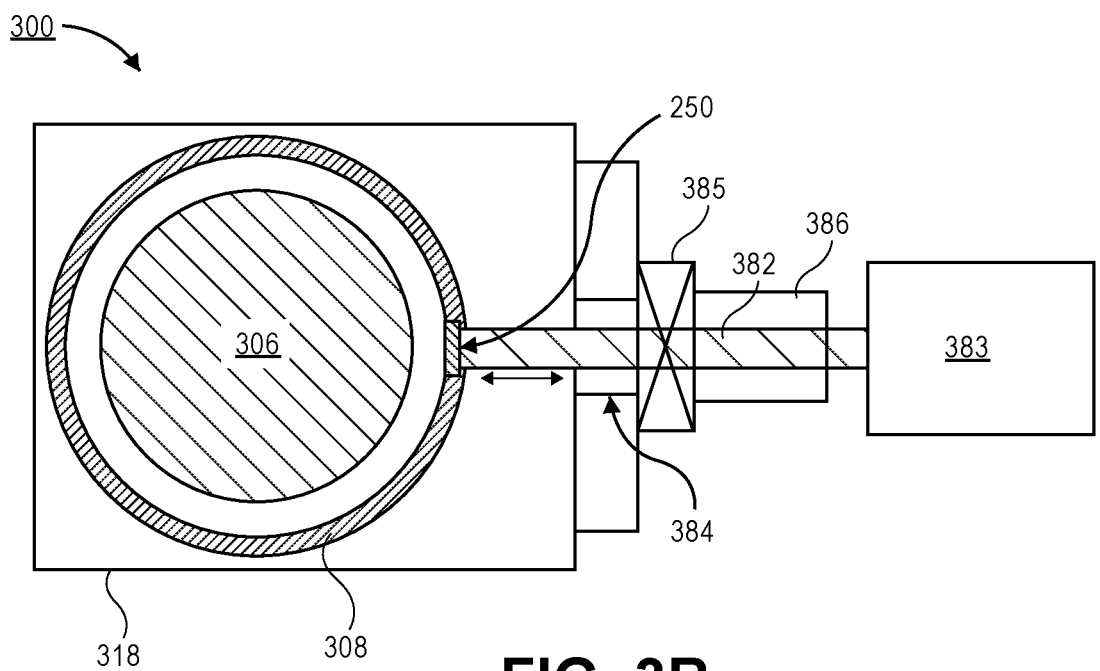
FIG. 3B is a schematic illustration of a processing tool for implementing a radical only etching process that shows a sensor integrated into a pump liner, according to an additional embodiment.

In an additional embodiment illustrated in FIG. 3B, the sensor 250 may be integrated into a pump liner 308 in the lower region 318 of the processing tool 300. As illustrated, the probe 382 may extend through an opening in the pump liner 308 with the sensor 250 being seated in the opening. For example, the face of the first electrode may be oriented towards the pedestal 306 and be substantially perpendicular to a surface of the pedestal 306 on which the substrate may be placed during processing. Integrating the sensor 250 with the pump liner 308 allows for the flow of radicals that passes by the sensor 250 to be substantially similar to the flow of radicals that passes by a substrate (not shown) that is processed in processing tool 300. In an embodiment, the sensor 250 may be located at a position in the processing tool 300 that allows for the etch rate of the sacrificial layer 270 to be representative and correlatable to the etch rate of a material formed on a substrate positioned on the pedestal. In an additional embodiment, the sensor 250 may be displaced within the processing tool 300 by extending or retracting the probe 382. As illustrated by the arrow in FIG. 3B, the probe 382 may be retracted so that the sensor 250 passes through a gate valve 385 and is removed from the lower region 318 of the processing tool 300. For example, the valve 385 may separate the lower region 318 of the processing tool 300 from an antechamber 386. In an embodiment, the antechamber 386 may be a storage chamber for the sensor 250 that is isolated from the radicals in the lower region 318. Accordingly, when the sensor 250 is positioned in the antechamber 386, the sensor will not be exposed to the etching process used to remove the sacrificial layer. In an embodiment, the antechamber 286 may include a vacuum pump and gas lines for purging the antechamber 286. This configuration provides several additional advantages that may increase the useable service life of the sensor 250 and/or decreases the downtime of the processing tool 300 when the sensor 250 is replaced after the useable service life of the sensor 250 is exceeded.

For example, in some embodiments it may not be necessary to provide real time etch rate monitoring for every substrate that is processed in the processing tool 300 (e.g., the real time etch rate may only be monitored for a single substrate in each lot of substrates, the real time etch rate may be monitored for every second, third, fourth, fifth, etc., substrate, or any other desired sampling plan). As such, embodiments include retracting the sensor 250 into the antechamber 386 whenever active etch rate monitoring is not needed in order to extend the useable service life of the sensor 250. Since the antechamber 386 is able to be purged and pumped down to the processing pressure (i.e., the antechamber 386 may function similar to a load lock), the main processing chamber does not need to be depressurized between uses of the sensor 250. Furthermore, during an in situ chamber cleaning operation, the sensor 250 may be protected by being retracted into the antechamber 386. As such, a processing operation that may otherwise substantially reduce the useable service life of the sensor 250 due to an aggressive etching chemistry may be implemented without damaging the sensor 250.

In embodiments that include an antechamber 386 and gate valve 385, the sensor 250 may also be replaced without needing to depressurize and/or open the main processing chamber. Instead, the antechamber 386 may be depressurized and opened to retrieve the used sensor 250 and insert a replacement sensor 250. Since the antechamber 386 is smaller than the main processing chamber, the time needed to pump the antechamber 386 back down to the processing pressure is reduced. Furthermore, the main processing chamber does not need to be opened, and there is no need to season the main processing chamber after the sensor 250 is replaced.

As noted above, the ability to monitor etch rates in real time provides several advantages that improve various processing outcomes used during the processing of a single substrate or a plurality of substrates. For example, in some embodiments real time etch rate monitoring may allow for closed loop process control that allows for an etching process recipe to be dependent on the actual thickness of material removed. In another embodiment, chamber matching between multiple processing tools executing a single processing recipe may be implemented when real time etch rate monitoring is enabled. Additional embodiments may allow for refining an etching process recipe as multiple substrates are processed by using substrate to substrate feedforward control. Further embodiments may allow for chamber health monitoring that allows for more accurate determination of when process tool maintenance is needed.

Figure 4:
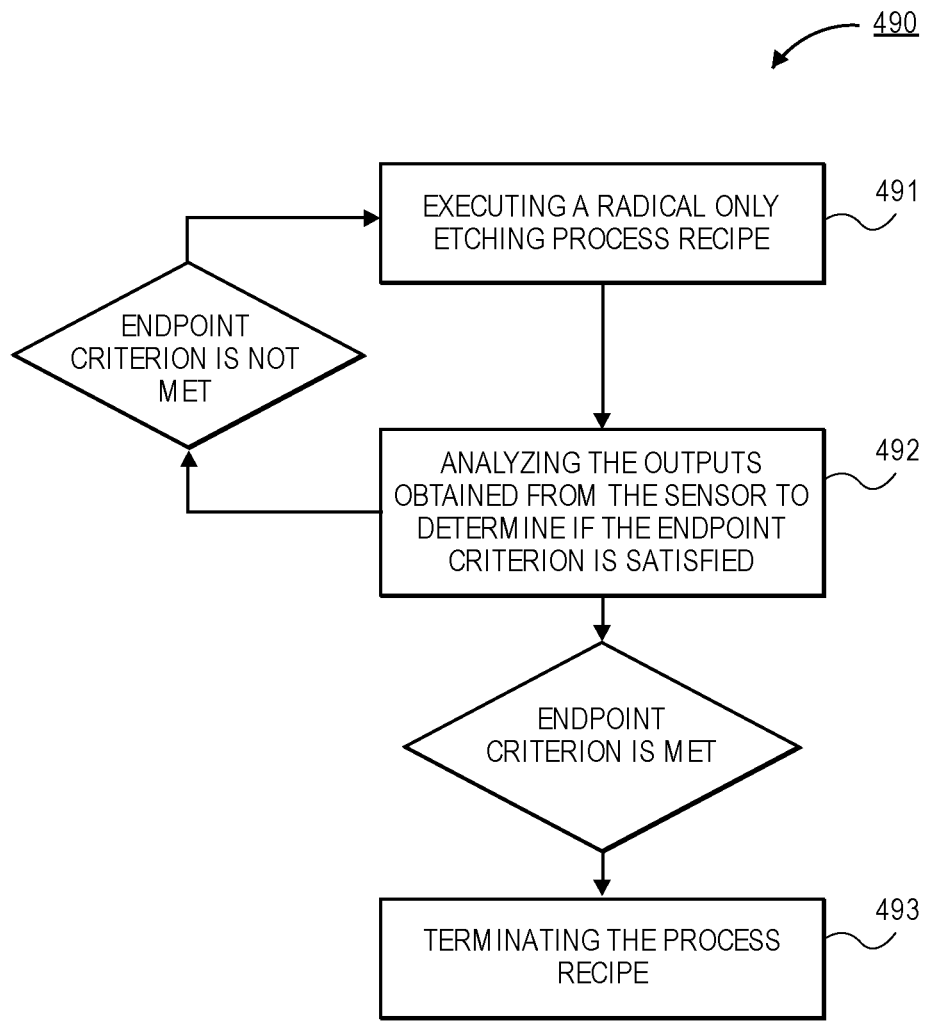
FIG. 4 is a process flow diagram that describes a process for using a sensor for closed loop process control, according to an embodiment.

In a particular embodiment, a sensor 250 substantially similar to those described above may be used to enable etching process recipes that are implemented with closed loop process control. Previously, when real time etch rate monitoring is not able to be implemented, the process recipe relies on a preset processing duration. Relying on a preset duration may be a problem because the conditions in the processing chamber may vary between substrates (e.g., due to variations in chamber conditions, inconsistent flow of radicals into the lower region, inconsistencies in previous processing operations on the substrates, etc.). However, embodiments that include a sensor 250, such as those described herein, provide the ability to implement closed loop process control that is not time dependent. Instead, the endpoint of the processing recipe may be determined by the actual thickness of material that is removed. For example, if the processing recipe is designed to remove 30 nm of material thickness, then the processing recipe may be terminated once the sensor 250 produces outputs that indicate 30 nm of material thickness has been removed from the substrate instead of approximating the removal of material from the substrate based on time. An exemplary process recipe that uses closed loop process control is shown in process flow chart 490 illustrated in FIG. 4.

Starting with the processing operation 491, embodiments may include executing a radical only etching process recipe. In an embodiment, the processing recipe may include any number of processing parameters that are to be used in the etching process. For example, the processing recipe may include process parameters, such as the desired substrate temperature, the flow rate of one or more processing gasses, the pressure in the processing chamber, or the like. Additionally, the processing recipe may include one or more endpoint criteria. In a particular embodiment, one endpoint criterion may be a parameter that is determinable from outputs obtained from the sensor 250. For example, the endpoint criterion may be a total thickness of material removed from the substrate, which may be determined by the change in resonance frequency of the resonating body 262, as is described above.

Referring now to processing operation 492, embodiments may continue by analyzing the outputs obtained from the sensor 250 to determine if the one or more endpoint criteria are satisfied. For example, the sensor 250 may determine if the desired thickness of material has been removed from the substrate by comparing an initial resonance frequency of the resonating body 262 (prior to the initiation of the processing recipe) to the present resonance frequency of the resonating body 262. When the desired endpoint criterion is not satisfied, the process 490 may loop back to processing operation 491 and the processing recipe continues to be executed. In an embodiment, processing operation 492 may be implemented substantially continuously or at predetermined intervals (e.g., every 5 second or less, every 1 second or less, every 0.01 second or less, or any other desired interval). According to an embodiment, once the desired endpoint criteria has been satisfied, the process may continue to processing operation 493 and the processing recipe may be terminated.

In an additional embodiment, the sensor 250 may be utilized to provide chamber matching. Chamber matching allows for multiple processing tools to process a plurality of substrates in parallel. In properly matched chambers, the process outcome of each substrate is substantially the same even when they are processed in different chambers. Accordingly, the differences between different lots or batches of substrates may be minimized and process uniformity is improved. For example, when each processing tool utilizes a sensor 250 to implement a closed loop processing recipe similar to the processing described above with respect to FIG. 4, the thickness of material removed from every substrate, regardless of which processing tool is used, will be substantially the same. As such, even when the processing tools have different etch rates due to variances in processing conditions, the process outcome may still be highly uniform.

Figure 5:
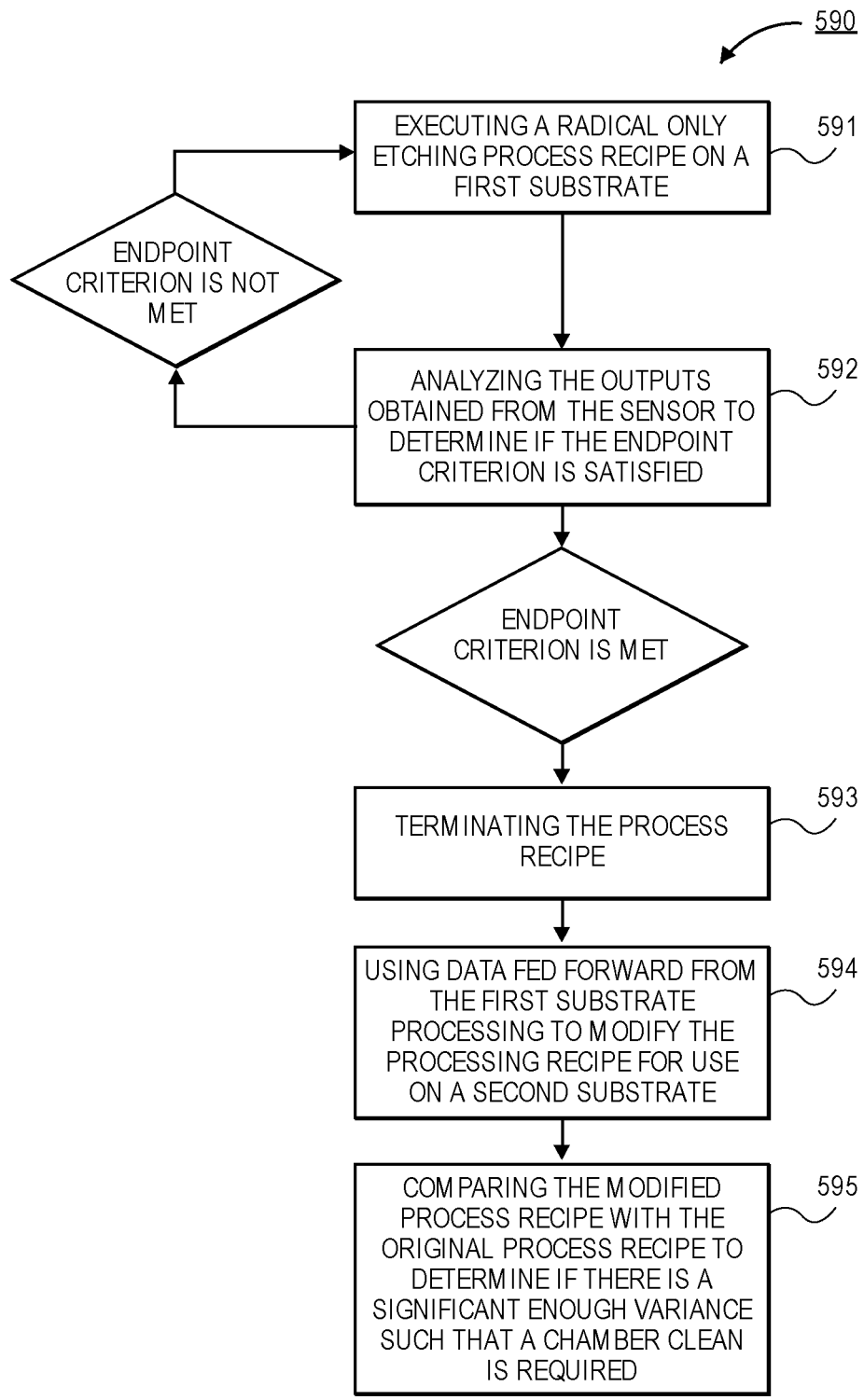
FIG. 5 is a process flow diagram that describes a process for using a sensor for substrate to substrate feed forward process control, according to an embodiment.

According to an additional embodiment, real time etch rate monitoring with a sensor 250 may also allow for substrate to substrate feedforward control of a processing recipe. Such an embodiment may be particularly beneficial because real time etch rate monitoring allows for the processing recipe to be modified after each substrate is processed. Therefore, even as processing conditions within the processing tool change (e.g., due to chamber cleanliness, or the like), a uniform process outcome may still be obtained. An example of a process for using substrate to substrate feedforward control of a processing recipe is illustrated in process flow 590 in FIG. 5.

In an embodiment, the process may begin with processing operation 591 by executing a processing recipe on a first substrate in a processing chamber. In an embodiment, the processing recipe is a recipe for a radical only etching process. In an embodiment, the processing recipe may include any number of processing parameters that are to be used in the etching process. For example, the processing recipe may include processing parameters, such as the desired substrate temperature, the flow rate of one or more processing gasses, the pressure in the processing chamber, or the like. In an embodiment, the process recipe may include one or more endpoint criteria. In a particular embodiment, one endpoint criterion may be a parameter that is determinable from outputs obtained from the sensor 250. For example, the endpoint criterion may be a total thickness of material removed, which may be determined by the change in resonance frequency of the resonating body 262, as is described above.

In an embodiment, the process flow advances to processing operation 592 where the outputs of the sensor 250 are analyzed to determine whether the endpoint criterion has been satisfied. If the endpoint criterion has not been satisfied, the process may loop back to operation 591, as shown. When the endpoint criterion has been satisfied, the procedure may advance to processing operation 593 and the process recipe is terminated. Thereafter, the procedure may advance to processing operation 594 where data from the processing of the first substrate is fed forward and used to modify the processing recipe for use on a second substrate. In an embodiment, the processing recipe may be modified by changing one or more of the processing parameters of the process recipe. For example, if the endpoint criterion took longer than expected to reach during the execution of the process recipe, then one or more of the processing parameters of the processing recipe may be modified to decrease the time needed to reach the endpoint criteria (e.g., by increasing the substrate temperature, increasing the flow rate of the processing gasses, etc.). Therefore, embodiments may include using feed forward information from a processing recipe executed on a first substrate in order to modify the process recipe for use on a second substrate. As such, the process recipe may be refined to allow for a desired outcome to be obtained in a more efficient manner.

Furthermore, process flow 590 may be extended to allow for process chamber health monitoring. Particularly, embodiments may include the additional operation of comparing the modified process recipe with the original process recipe to determine if there is a significant enough variance such that chamber maintenance is needed, as illustrated in processing operation 595. For example, comparing the modified process recipe with the original process recipe may include calculating the differences between one or more of the processing parameters in the modified process recipe and the original process recipe. In an embodiment, the chamber maintenance may include any adjustment to the chamber conditions, such as a chamber clean or replacement and/or refurbishment of one or more components that have been determined to be at the end of their service life.

In an embodiment, a significant variation that indicates that a chamber clean is needed may be when the difference of one or more of the process parameters in the modified process recipe and the original process recipe exceeds a predetermined threshold value. In an embodiment, the predetermined threshold value may be a maximum percentage change in a given process parameter. For example, the predetermined threshold value may be a 25% change or greater in a given process parameter. In an embodiment, each process parameter may have a different predetermined threshold value. For example, the predetermined threshold value for the percentage change in the flow rate of a processing gas may be larger than the predetermined threshold value for the percentage change in the temperature of the substrate. In an additional embodiment, the predetermined threshold value may be a maximum or minimum value for a given processing parameter. For example, the predetermined threshold value for the substrate temperature may be a maximum temperature. In yet another embodiment, the type of predetermined threshold value may be dependent on the process parameter. For example, one or more process parameters in a processing recipe may have a predetermined threshold value that is given as a maximum percentage change of the process parameter and other process parameters in the processing recipe may have a predetermined threshold value that is given as a maximum and/or minimum value.

Figure 6:
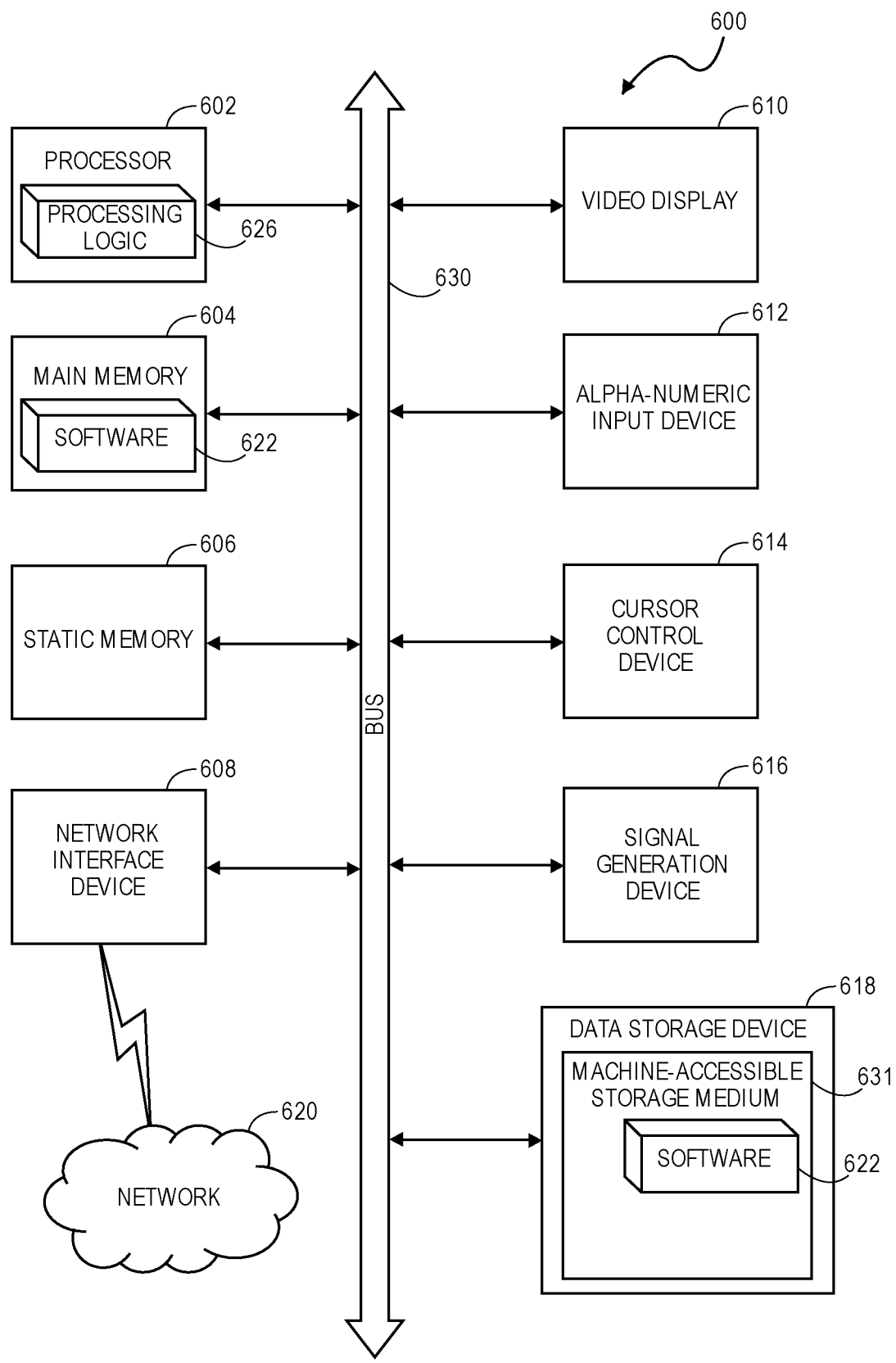
FIG. 6 illustrates a block diagram of an exemplary computer system that may be used in conjunction with processes that include monitoring the etch rate of a radical only etching process in real time, in accordance with an embodiment.

Referring now to FIG. 6, a block diagram of an exemplary computer system 660 of a processing tool is illustrated in accordance with an embodiment. In an embodiment, computer system 660 is coupled to and controls processing in the processing tool. Computer system 660 may be connected (e.g., networked) to other machines in a Local Area Network (LAN), an intranet, an extranet, or the Internet. Computer system 660 may operate in the capacity of a server or a client machine in a client-server network environment, or as a peer machine in a peer-to-peer (or distributed) network environment. Computer system 660 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 660, the term "machine" shall also be taken to include any collection of machines (e.g., computers) that individually or jointly execute a set (or multiple sets) of instructions to perform any one or more of the methodologies described herein.

Computer system 660 may include a computer program product, or software 622, having a non-transitory machine-readable medium having stored thereon instructions, which may be used to program computer system 660 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 660 includes a system processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

System processor 602 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 602 may also be one or more special-purpose processing devices such as an application specific integrated circuit (ASIC), a field programmable gate array (FPGA), a digital signal system processor (DSP), network system processor, or the like. System processor 602 is configured to execute the processing logic 626 for performing the operations described herein.

The computer system 660 may further include a system network interface device 608 for communicating with other devices or machines. The computer system 660 may also include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium 631 (or more specifically a computer-readable storage medium) on which is stored one or more sets of instructions (e.g., software 622) embodying any one or more of the methodologies or functions described herein. The software 622 may also reside, completely or at least partially, within the main memory 604 and/or within the system processor 602 during execution thereof by the computer system 660, the main memory 604 and the system processor 602 also constituting machine-readable storage media. The software 622 may further be transmitted or received over a network 620 via the system network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. An etch rate sensor, comprising:
a resonating body;
a first electrode formed on a first surface of the resonating body, the first electrode having a top surface;
a second electrode formed over a second surface of the resonating body; and
a sacrificial layer formed on the top surface of the first electrode, wherein a portion of the top surface of the first electrode is not covered by the sacrificial layer, the portion of the top surface of the first electrode continuously around an entirety of the sacrificial layer, and wherein the sacrificial layer is not in contact with the resonating body.

2. The etch rate sensor of claim 1, wherein the sacrificial layer is a material that is selectively etched with respect to the first electrode in a radical only etching process.

3. The etch rate sensor of claim 2, wherein the sacrificial layer is a dielectric material, a semiconductor material, or a conductive material.

4. The etch rate sensor of claim 1, further comprising a plurality of additional sacrificial layers formed on the first electrode, wherein each of the plurality of additional sacrificial layers is etched selective to each other, to the sacrificial layer and to the first electrode.

5. The etch rate sensor of claim 4, wherein the sacrificial layer is formed over an approximate center of the first electrode, and wherein the additional sacrificial layers are formed in substantially concentric rings around the sacrificial layer.

6. The etch rate sensor of claim 4, wherein each of the plurality of sacrificial layers is formed over a different region of the first electrode.

7. The etch rate sensor of claim 1, wherein the resonating body is quartz, sapphire, silicon, germanium, or lead zirconate titanate.

8. The etch rate sensor of claim 1, further comprising:
a frequency bridge electrically coupled between the first electrode and the second electrode.

9. The etch rate sensor of claim 8, wherein the first electrode is electrically coupled to a ground potential.

10. A process tool, comprising:
a remote plasma chamber;
a main processing chamber coupled to the remote plasma chamber, wherein the main processing chamber comprises:
an upper portion; and
a lower portion, wherein the upper portion is separated from the lower portion by an ion filter; and
an etch rate sensor located in the lower portion of the main processing chamber, wherein the etch rate sensor comprises:
a resonating body;
a first electrode formed on a first surface of the resonating body, the first electrode having a top surface;
a second electrode formed over a second surface of the resonating body; and
a sacrificial layer formed on the top surface of the first electrode, wherein a portion of the top surface of the first electrode is not covered by the sacrificial layer, the portion of the top surface of the first electrode continuously around an entirety of the sacrificial layer, and wherein the sacrificial layer is not in contact with the resonating body.

11. The process tool of claim 10, wherein the etch rate sensor is coupled to a monitor outside of the main processing chamber by a probe that passes through a port in the lower portion of the main processing chamber.

12. The process tool of claim 11, further comprising:
an antechamber separated from the lower portion of the main chamber by a gate valve, wherein the probe is retractable through the valve so that the etch rate sensor is moveable between the antechamber and the lower portion of the main chamber.

13. A process tool, comprising:
a remote plasma chamber;
a main processing chamber coupled to the remote plasma chamber, wherein the main processing chamber comprises:
an upper portion; and
a lower portion, wherein the upper portion is separated from the lower portion by an ion filter; and
an etch rate sensor located in the lower portion of the main processing chamber, wherein the etch rate sensor is coupled to a monitor outside of the main processing chamber by a probe that passes through a port in the lower portion of the main processing chamber, wherein the etch rate sensor comprises:
a resonating body;
a first electrode formed on a first surface of the resonating body;
a second electrode formed over a second surface of the resonating body; and
a sacrificial layer formed on the first electrode, wherein at least a portion of the first electrode is not covered by the sacrificial layer; and
an antechamber separated from the lower portion of the main chamber by a gate valve, wherein the probe is retractable through the valve so that the etch rate sensor is moveable between the antechamber and the lower portion of the main chamber.

* * * * *